United States Patent
Won et al.

(10) Patent No.: US 7,453,269 B2
(45) Date of Patent: Nov. 18, 2008

(54) MAGNETIC MEMS SENSOR DEVICE

(75) Inventors: Jong-hwa Won, Suwon-si (KR); Hyung Choi, Seongnam-si (KR); Kwon-hee Kim, Seoul (KR); Oh-myoung Kwon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/029,006

(22) Filed: Jan. 5, 2005

(65) Prior Publication Data

US 2005/0252293 A1    Nov. 17, 2005

(30) Foreign Application Priority Data

May 11, 2004    (KR)    ............ 10-2004-0032948

(51) Int. Cl.
*G01R 27/26* (2006.01)
(52) U.S. Cl. ............ 324/658; 324/207.13; 324/207.22; 324/207.23
(58) Field of Classification Search ............ 324/658; 310/90, 40, 309; 335/216
See application file for complete search history.

(56) References Cited

U.S. PATENT DOCUMENTS

| | | | |
|---|---|---|---|
| 4,997,521 A * | 3/1991 | Howe et al. .......... 216/17 |
| 5,015,906 A * | 5/1991 | Cho et al. ............ 310/309 |
| 5,396,136 A | 3/1995 | Pelrine |
| 5,965,968 A * | 10/1999 | Robert et al. .......... 310/310 |
| 6,049,148 A * | 4/2000 | Nichols et al. ......... 310/68 B |
| 6,208,497 B1 * | 3/2001 | Seale et al. ........... 361/160 |
| 6,216,571 B1 * | 4/2001 | Newell et al. .......... 82/1.11 |
| 6,307,285 B1 * | 10/2001 | Delson et al. .......... 310/14 |
| 6,497,141 B1 * | 12/2002 | Turner et al. ........... 73/105 |
| 6,534,887 B1 | 3/2003 | Peczalski et al. |
| 6,566,775 B1 * | 5/2003 | Fradella .............. 310/90.5 |
| 6,770,993 B1 * | 8/2004 | Heshmat et al. ......... 310/90.5 |

* cited by examiner

*Primary Examiner*—Vincent Q. Nguyen
*Assistant Examiner*—Thomas F. Valone
(74) *Attorney, Agent, or Firm*—Sughrue Mion, PLLC

(57) ABSTRACT

A microelectromechanical system (MEMS) sensor and method for measuring the motion of an intermediate member and a method for making the MEMS sensor. The MEMS sensor includes a substrate, a lower magnetic member disposed on the substrate, a layer disposed over the substrate, an upper magnetic member disposed at a side of the layer facing the lower magnetic member, an intermediate magnetic member magnetically levitated between the lower magnetic member and upper magnetic member; and a component measuring at least one of motion, forces acting on, and a displacement of the intermediate magnetic member.

22 Claims, 9 Drawing Sheets

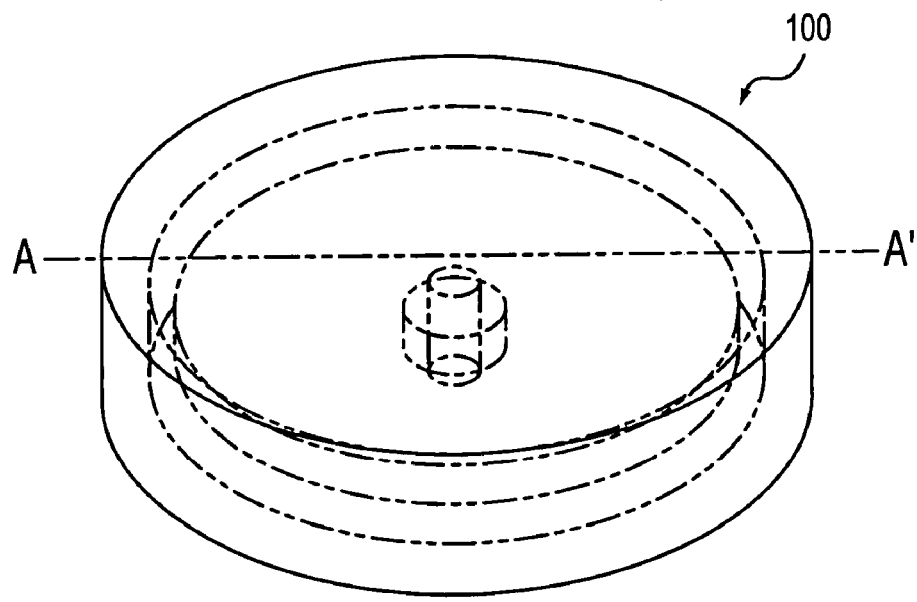
FIG. 1
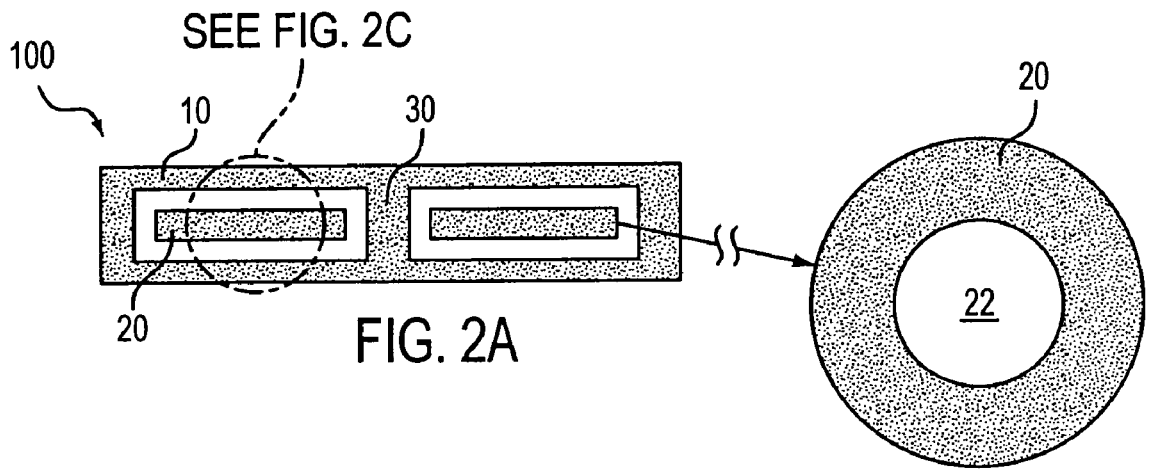
FIG. 2A
FIG. 2B
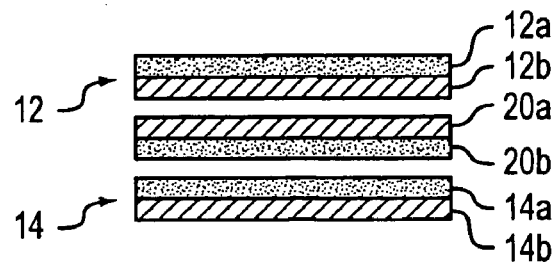
FIG. 2C

MAGNETIC MEMS SENSOR DEVICE

BACKGROUND OF THE INVENTION

1. Field of the Invention

Apparatuses and methods consistent with the present invention relate to magnetic devices fabricated using microelectromechanical system (MEMS) process. Specifically, the apparatuses and methods relate to MEMS magneto-floating sensors, a method for fabricating a MEMS magneto-floating sensor, and a method of using a MEMS magneto-floating sensor to detect displacement, motion and force.

2. Description of the Related Art

Advances in micromachining technology have advanced the development of miniature MEMS sensors. An example of a MEMS sensor is a piezoelectric sensor which is used in a variety of applications, ranging from pressure sensors to accelerometers for automobile airbags. The use of piezoelectric devices as sensors, however, is limited due to their sensitivity to variations in temperature.

Another example of a MEMS sensor is a mass-spring system accelerometer. Such accelerometers, however, require complicated designs to fabricate and it is often difficult to accurately model the spring constant of the MEMS-scale spring, allowing for the possibility of inaccurate measurements.

SUMMARY OF THE INVENTION

To solve the problems above, the present invention is conceived. A novel microelectromechanical system (MEMS) sensor for accurate measurement of motions, forces or displacement is provided.

An embodiment of a MEMS sensor comprises a lower magnetic member; an upper magnetic member disposed over said lower magnetic member; an intermediate magnetic member magnetically levitated between said lower magnetic member and upper magnetic member; and a detector measuring at least one of motion of, force acted on, and displacement of the intermediate magnetic member with respect to the lower magnetic member and the upper magnetic member.

Another embodiment of the invention is a method of forming a MEMS device comprising a lower magnetic member, an intermediate magnetic member, and an upper magnetic member, the method comprising: applying a first external magnetic field to the lower and the upper magnetic members and said intermediate magnetic member; inducing magnetic polarities in each of the lower and the upper magnetic members and said intermediate magnetic member in a first orientation; applying a second external magnetic field to the lower and the upper magnetic members and said intermediate magnetic member; and reversing a magnetic polarity of only one of i) said intermediate magnetic member and ii) the lower and upper magnetic members to a second orientation.

An aspect of the present invention is a method of measuring a displacement of an inner member magnetically levitated between a lower and an upper member of a MEMS device, the method comprising: measuring a current and a resonant frequency of the current through said lower member, inner member, and upper member; and calculating the displacement of the inner member from said current and resonant frequency of said current.

Another method of measuring a displacement of an inner member is to measure the change of capacitance between the inner member and outer member, that is, between the inner member and at least one of the lower and upper member.

Another aspect of the present invention is a method of measuring a displacement or a motion of a MEMS device comprising an inner member magnetically levitated between a lower member and an upper member, at least one signal component disposed on said inner member, and a detector disposed on said lower member and/or upper member, the method comprising: detecting a signal emitted from said at least one signal component when said at least one signal component proximally passes said detector when the inner member moves; and calculating a displacement of, forces acting on, or a motion of the inner member from the signal.

Yet another aspect of the present invention is a method of measuring an angular motion of a MEMS device comprising an inner member magnetically levitated between a lower member and an upper member, at least one signal component disposed on said inner member, and a detector disposed on said lower member and/or upper member, the method comprising: detecting a signal emitted from said at least one signal component when said signal component proximally passes said detector when the inner member rotates; and calculating at least one of angular velocity and angular acceleration of said inner member from the signal.

An exemplary embodiment of the invention is a MEMS sensor comprising: a substrate; a lower magnetic member disposed on said substrate; a layer disposed over said substrate; an upper magnetic member disposed at a side of said layer facing said lower magnetic member; an intermediate magnetic member magnetically levitated between said lower magnetic member and upper magnetic member; and a means for measuring at least one of motion of, forces acting on, and displacement of the intermediate magnetic member.

BRIEF DESCRIPTION OF THE DRAWINGS

The above and other aspects and advantages of the present invention will become more apparent by describing in detail exemplary embodiments thereof with reference to the attached drawings in which:

FIG. 1 is a perspective view according to a first embodiment of the invention;

FIG. 2A is a cross sectional view taken through A-A' in FIG. 1;

FIG. 2B is a plan view of the inner member of FIG. 2A;

FIG. 2C is a detailed cross sectional view of a portion of FIG. 2A;

DETAILED DESCRIPTION OF THE EXEMPLARY EMBODIMENTS

Figure 3A:
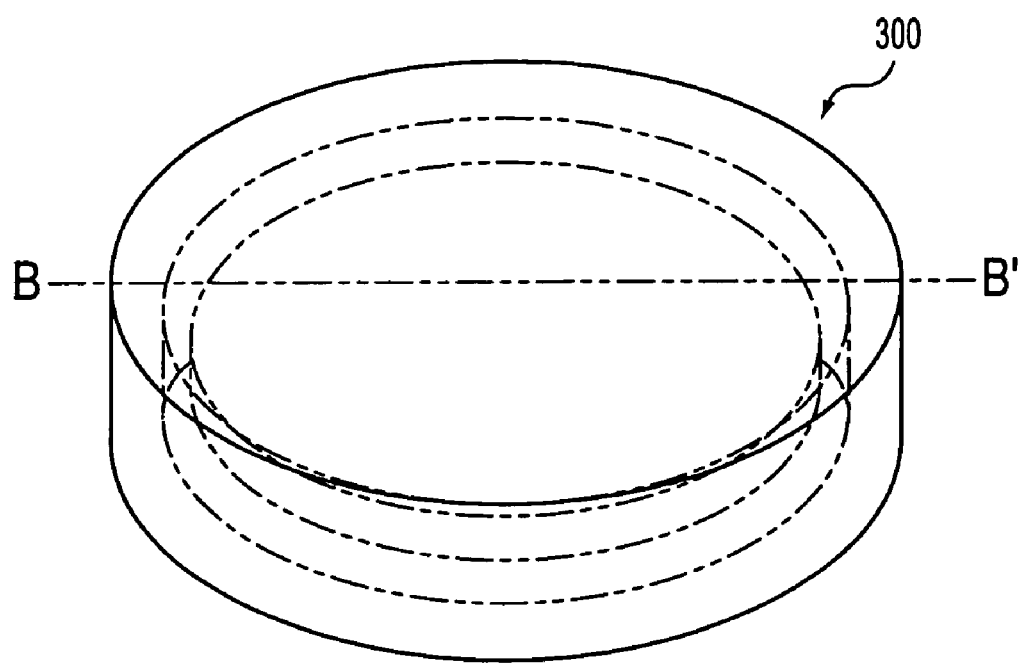
FIGS. 3A-B are views of another embodiment of the invention.

An apparatus according to one aspect of the present invention includes an outer member formed from a wafer such as a Si wafer and an inner member fabricated inside the outer member. A magnetic material is laminated onto the outer and inner members so that repulsive magnetic forces magnetically levitate the inner member.

In FIGS. 1 and 2A-C, an exemplary embodiment of the present invention is shown. The magnetic sensor device 100 includes an outer member 10 and an inner member 20. The outer member 10 includes an upper member 12 and a lower member 14. The inner member 20 is disk-shaped with a center hole 22, as shown in the cross sectional view A-A' of the inner member 20 (FIG. 2B). The inner member 20 is disposed between the upper and the lower members 12, 14. A spindle 30 is disposed inside the outer member 10 and passes through the center hole 22 of the inner member 20. The outer and the inner members 10, 20 each has magnetic properties arising from the magnetic materials disposed at the outer and inner members 10, 20.

In FIG. 2C, the magnetic polarities of the outer and the inner members 10, 20 are shown. At the upper member 12, there is a first magnetic pole 12a of a first magnetic polarity above a second magnetic pole 12b of a second magnetic polarity. The inner member 20 has a third magnetic pole 20a of the second magnetic polarity above a fourth magnetic pole 20b of the first magnetic polarity. The lower member 14 has a fifth magnetic pole 14a of the first magnetic polarity above a sixth magnetic pole 14b of the second magnetic polarity. When the inner member 20 and/or upper member 12 is too thin and/or flexible, a supporting layer may be added on the top or at the bottom of the inner member 20 and/or the upper member 12.

In an exemplary embodiment, the first and second magnetic polarities are opposite magnetic polarities. In an example, the first magnetic polarity may be a North magnetic polarity, and the second magnetic polarity may be a South magnetic polarity. Alternatively, the first magnetic polarity may be a South magnetic polarity, and the second magnetic polarity may be a North magnetic polarity.

Because the opposing surfaces of the upper member 12 and the inner member 20, and the opposing surfaces of the lower member 14 and the inner member 20, respectively, have the same magnetic polarity, the inner member 20 is magnetically levitated or suspended between the upper and lower members 12, 14.

Figure 3B:
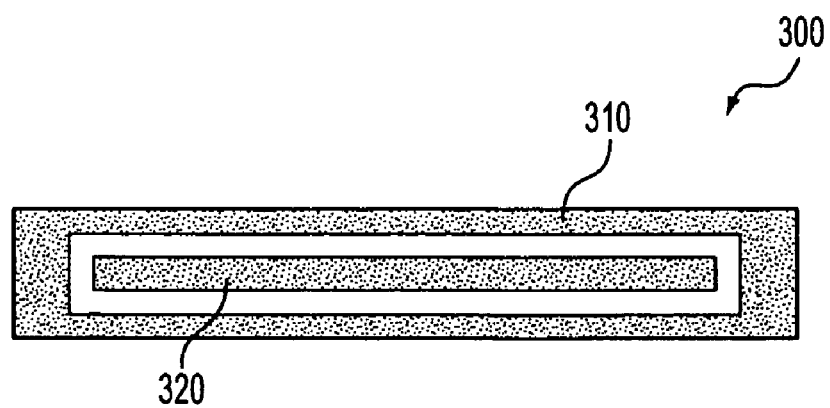
Figure 3C:
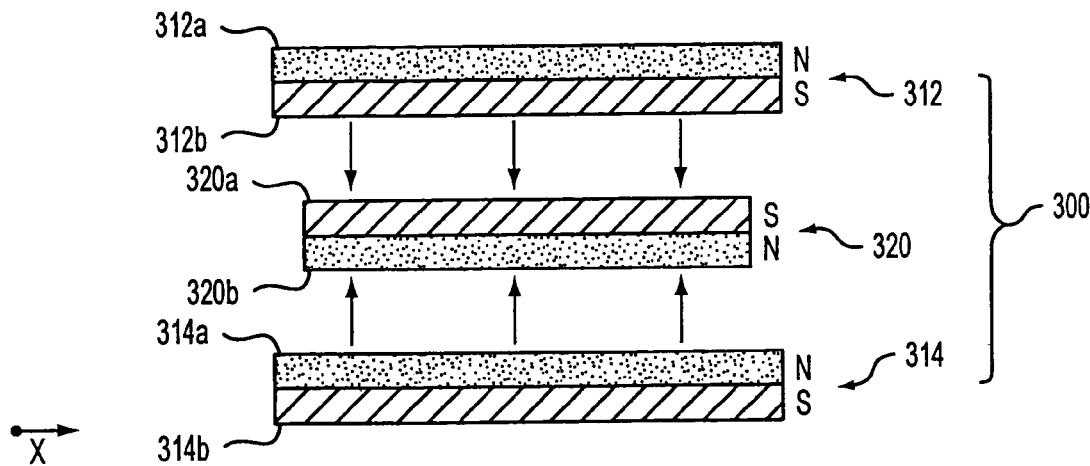
FIG. 3C illustrates an embodiment of a centering means.

In another embodiment, a magnetic sensor device 300 is shown in FIGS. 3A-C. In FIG. 3C, 310 designates an outer member having an upper member 312 and a lower member 314. The upper member 312 has a first magnetic pole 312a having a first magnetic polarity and a second magnetic pole 312b having a second magnetic polarity. An inner member 320 having a third magnetic pole 320a having the second magnetic polarity and fourth magnetic pole 320b having the first magnetic polarity, is disposed between the upper member 312 and the lower member 314. The lower member 314 has a fifth magnetic pole 314a having the first magnetic polarity and a sixth magnetic pole 314b having the second magnetic polarity. In this embodiment, the opposing surfaces of the upper member 312 and the inner member 320, and the opposing surfaces of the lower member 314 and the inner member 320 have the same magnetic polarity to magnetically levitate the inner member 320. When the inner member 320 and/or the upper member 312 are so thin and flexible as to make a supporting layer desirable, a supporting layer may be added on top or bottom of the inner member 320 and/or the upper member 312. Additionally, the surface areas of the upper and inner members 312, 314 parallel to the x-axis are each larger than the opposing surface area of the inner member 320. With this configuration, when the inner member moves along the x-axis, strong repulsive force pushes the inner member to the center position.

Figure 4:
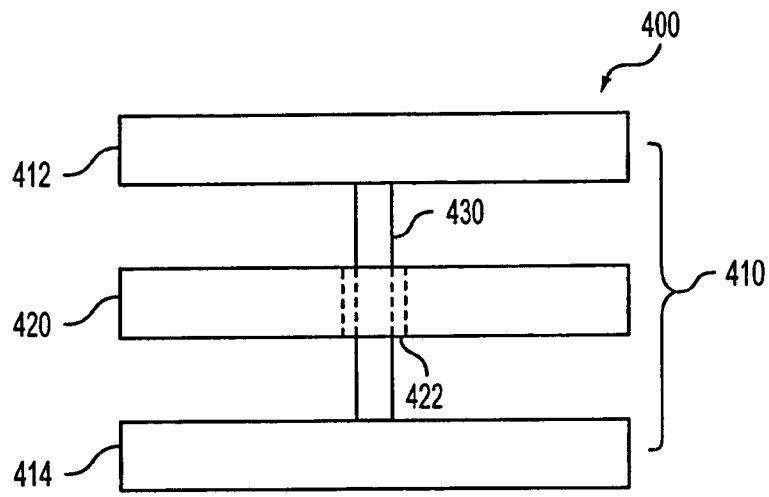
FIG. 4 illustrates an alternative embodiment of the centering means.

FIG. 4 shows another embodiment having an outer member 410, which includes an upper member 412 and a lower member 414. A spindle 430, a center hole 422, and the relatively larger magnetic areas of the upper and lower members 412, 414 center the inner member 420 inside the outer member 410.

Figure 5:
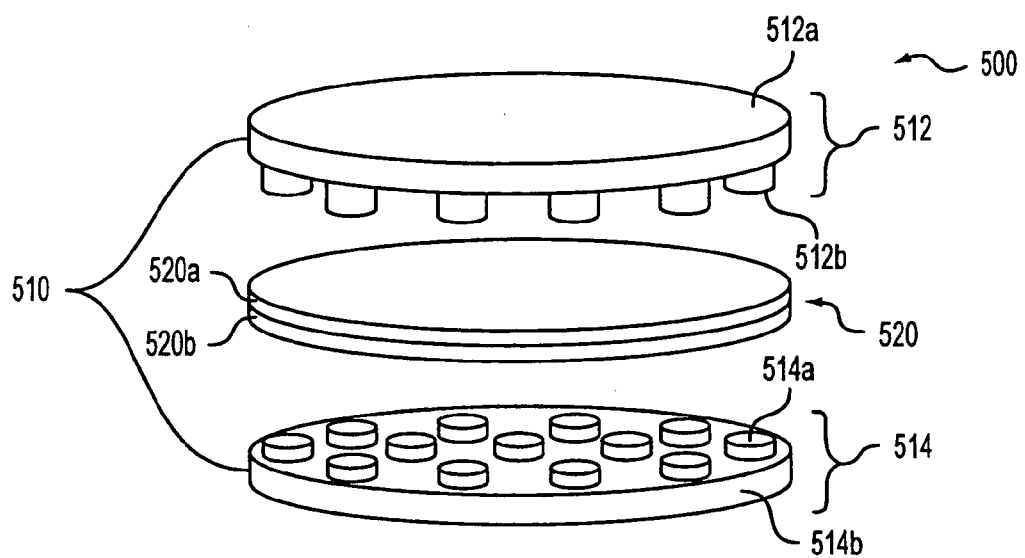
FIG. 5 is an embodiment of the invention for detecting linear displacement of a magnetically levitated inner member.

In yet another embodiment shown in FIG. 5, there is an outer member 510 which includes an upper member 512 and a lower member 514. The upper member 512 includes a first layer 512a and discrete magnetic structures 512b. Each of the discrete magnetic structures 512b may be island-like ("island-type"), pillar shaped, cylindrically shaped, polygonal shaped, or of any other shape. The discrete magnetic structures 512b are disposed below the first layer 512a. Similarly, the lower member 514 includes discrete magnetic structures 514a disposed on the second layer 514b. One advantage of such discrete magnetic structures is that when compared to magnetic structures made of the same material, the combined field strength of discrete magnetic structures is stronger due to a weaker demagnetizing field present in the discrete magnetic structures. The demagnetizing field inside a magnet reduces the magnetic field strength of a magnet and is a function of the geometry of the magnet. Generally, when the ratio of the thickness to the surface area of a magnet is large, the demagnetizing field is weak to allow a stronger magnetic field strength. Thus, the discrete magnetic structures 512b, 514a impart a relatively stronger magnetic field strength to center the inner member 520 having magnetic layers 520a, 520b. In another embodiment, the magnetic layer of the inner member 520 has discrete magnetic structures so that the inner member 520 is sufficiently levitated between the upper and the lower members 512, 514.

Figure 6A:
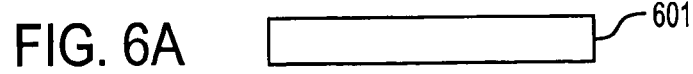
FIGS. 6A-6M show the steps of fabricating the present invention.
Figure 6B:
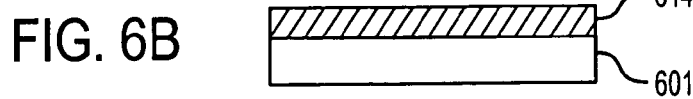
Figure 6C:
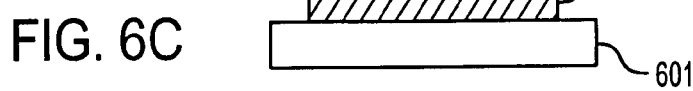
Figure 6D:
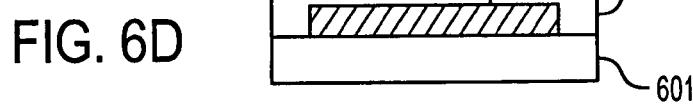
Figure 6E:
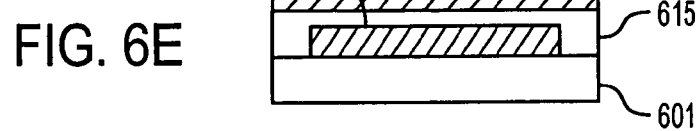
Figure 6F:
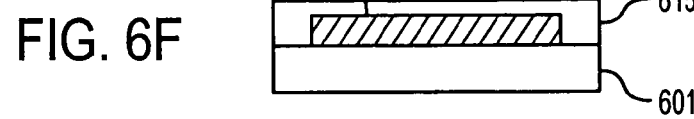
Figure 6G:
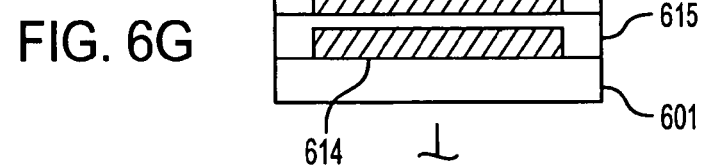
Figure 6H:
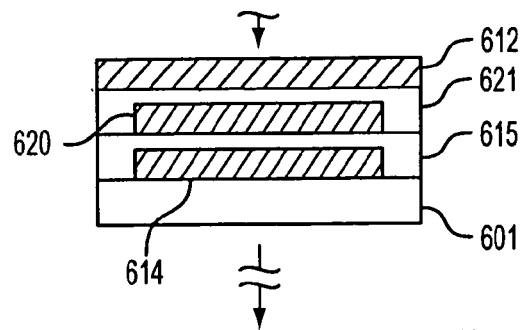
Figure 6I:
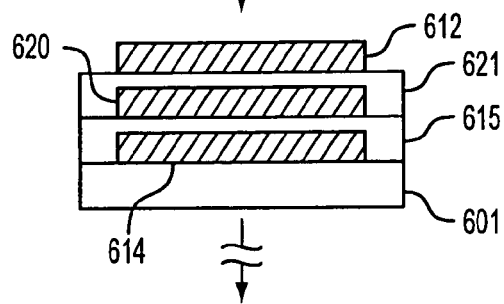
Figure 6J:
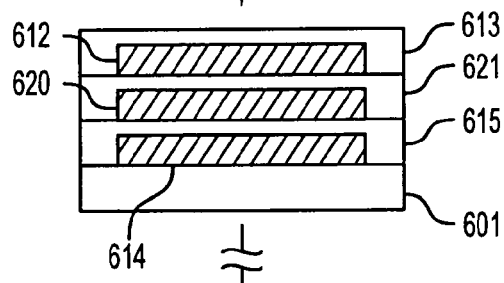

Steps involved in the fabrication of the magnetic sensor devices 100, 300, 400, 500 of the present invention are shown in FIGS. 6A-M. The steps shown use conventional lithographic methods and techniques. Starting with a wafer substrate 601 (FIG. 6A), a lower magnetic layer 614 is formed to be the lower member (14, 314, 414, or 514), on the substrate 601 (FIG. 6B). After patterning the lower magnetic layer 614 (FIG. 6C), a first sacrificial layer 615 is formed over the lower magnetic layer 614 (FIG. 6D). A middle magnetic layer 620 is formed to be the inner member (20, 320, 420, or 520) over the first sacrificial layer 615 (FIG. 6E) and patterning of the middle magnetic layer 620 is performed (FIG. 6F). A second sacrificial layer 621 is formed over the middle magnetic layer 620 (FIG. 6G) and then a upper magnetic layer 612 is formed to be the upper member (12, 312, 412 or 512) (FIG. 6H). After patterning the upper magnetic layer 612 (FIG. 6I), a structure layer 613 is formed and patterned (FIG. 6J). Ferromagnetic materials are used in forming the magnetic layers 612, 614, 620.

In one embodiment, magnetic films are laminated to form the magnetic layers 612, 614, 620. Roll-type magnetic films can be used. Alternatively, the magnetic layers 612, 614, 620 can be formed by conventional physical vapor deposition, sputtering, electroplating, etc, of ferromagnetic materials. Magnetic materials having high anisotropy, highly square hysteresis curves (high remanent magnetization level/magnetic saturation level (Br/Bs)), high saturation levels $B_s$, and high coercivities $H_c$ may be used for i) the upper and lower magnetic layers 612, 614, and ii) the middle magnetic layer 620. Examples of vertical magnetic media used for the inner and outer members include PtCo (Hc≈4300 Oe), 21Mn79Bi (Hc≈3650 Oe), SrO.6Fe2O3 (Hc≈3330 Oe), BaO.6Fe2O3 (Hc≈1850-2900 Oe), 60Cu 20Ni 20Fe (Hc≈590 Oe), and 50Cu 20Ni 2.5Co 27.5Fe (Hc≈260 Oe).

Figure 6K:
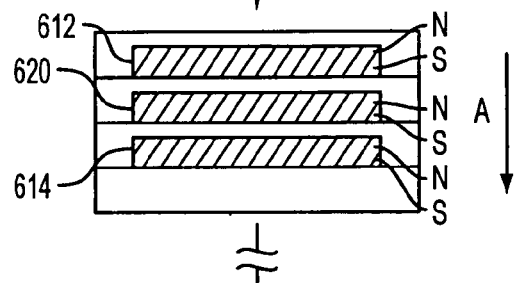

Then an external first magnetic field A is applied to magnetize the upper, lower, and middle magnetic layers 612, 614, 620 as shown in FIG. 6K. In the exemplary embodiment, the ferromagnetic material used for the upper and lower magnetic layers 612, 614 has a coercivity $H_c$ that is higher than the coercivity $H_c$ of the middle magnetic layer 620. Hence, the hysteresis curve of the ferromagnetic material used for the middle magnetic layer 620 is smaller than the hysteresis curve of the ferromagnetic material used for the upper and lower magnetic layers 612, 614. In other words, the saturation point for induced magnetization and the applied external magnetic field to achieve the saturation level are both larger in magnitude for the upper and lower magnetic layers 612, 614 than the saturation level and the applied external magnetic field for the middle magnetic layer 620.

After the first external magnetic field A is removed, the magnetic materials in the upper, lower, and middle magnetic layers 612, 614, 620 remain substantially at respective remanent magnetization levels and have polarities in a first orientation as shown in FIG. 6K.

Figure 6L:
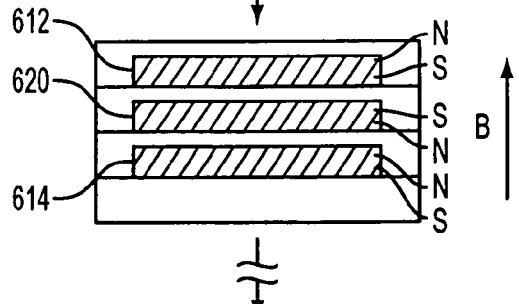

Then a second external magnetic field B is applied in a direction opposite to the first external magnetic field A (FIG. 6L). The second external magnetic field strength is less than the strength of the first external magnetic field A, and the magnetization of the middle magnetic layer 620 is reversed by the second external magnetic field B due to the weaker ferromagnetic quality of the middle magnetic layer 620. Because the magnetic material used for the upper and lower magnetic layers 612, 614 has a stronger resistance to change, i.e., larger coercivity $H_c$, the upper and lower magnetic layers 612, 614 retain the direction of magnetization induced by the first external magnetic field A.

Alternatively, the ferromagnetic material used for the upper and lower magnetic layers 612, 614 has a coercivity $H_c$ that is lower than the coercivity $H_c$ of the middle magnetic layer 620. In such an arrangement, the middle magnetic layer 620 retains the direction of magnetization induced by the first external magnetic field A and the upper and lower magnetic layers 612, 614 change their direction of magnetization according to the second external magnetic field B.

Figure 6M:
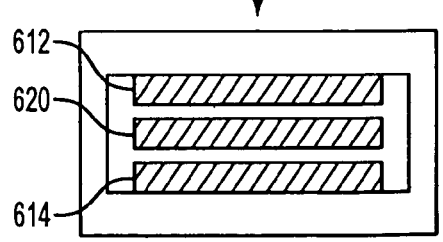

Next, in FIG. 6M, the first and second sacrificial layers 615, 621 are removed to form the upper member (12, 312, 412, or 512), lower member (14, 314, 414, or 514), and the inner member (20, 320, 420, or 520) of the magnetic sensor devices 100, 300, 400, 500. Although FIG. 6M shows the upper, lower, and middle magnetic layers 612, 614, 620 as being patterned to have the same surface area, the middle magnetic layer 620 can be patterned to have a smaller surface area than the upper and lower magnetic layers 612, 614 as shown in FIG. 3C, or more than one layer of the upper, the lower and the middle magnetic layers 612, 614, 620 may be patterned to have the discrete magnetic structure of FIG. 5.

For adding the first, second and third magnetic layers, removing the sacrificial layers, and patterning, micromachining processing techniques including bulk micromachining, surface micromachining, Si fusion bonding, deep reactive ion etching, high-aspect-ratio lithography and plating processes may be used.

The embodiments of the present invention described above may be used in various devices. Examples of such devices include an accelerometer, a magnetometer, a position sensor, an altimeter, etc.

Figure 7A:
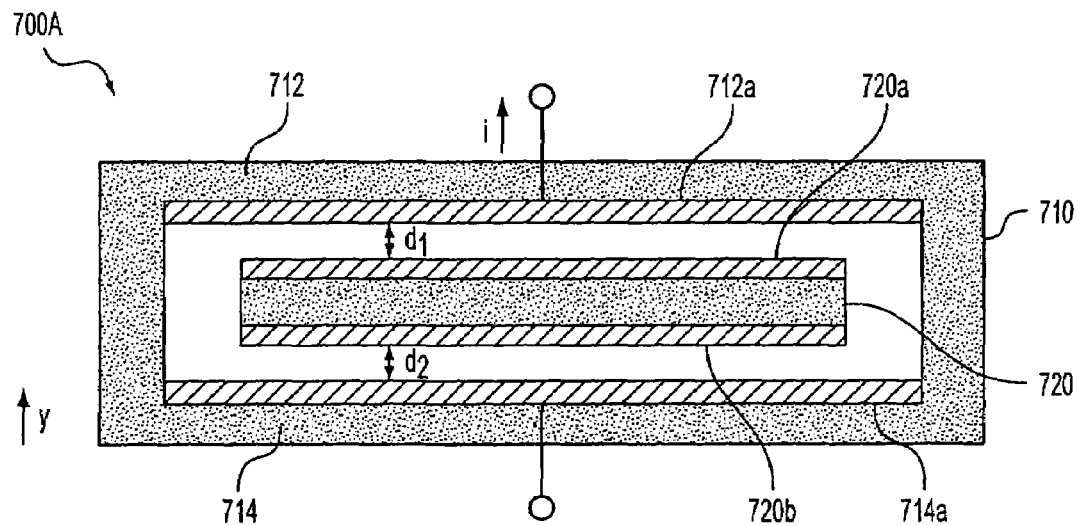
FIG. 7A is an embodiment of the invention as an accelerometer.

A magnetic sensor device 700A is shown in FIG. 7A. Here, the magnetic sensor device 700A is an accelerometer used to detect linear acceleration in the y direction. There are parallel plate electrodes 712a, 714a disposed at the inner surfaces of the upper and lower members 712, 714. There are also parallel plate electrodes 720a, 720b disposed on the inner member 720. Capacitance C1 between the parallel plate electrodes 712a and 720a and capacitance C2 between the parallel plate electrodes 720b and 714a are measured. In another embodiment, the inner member 720 presents an inductance to electrons flowing between the parallel plate electrodes 712a and 714a. In one embodiment, a electrical coupling such as a conductor 721 or an inductor 722 is patterned on the inner member 720 to electrically couple the parallel plate electrodes 720a, 720b (FIG. 7C, 7D). Taking C1=C2 as a reference point, the resonant frequency for the magnetic sensor device 700A and the current passing through the magnetic sensor device 700A from electrode 712a to electrode 714a change when C1≠C2. Specifically, there is one large resonant frequency when C1=C2, but when C1≠C2, there are two, separate, resonant frequencies. Detecting the change in the resonant frequency and the current allows the determination of the change in capacitances C1 and C2, and hence, the displacement of the inner member 720 with respect to the outer member 710, and hence, the acceleration.

Using the same principles as above, the magnetic sensor device 700A can serve as a magnetometer. An external magnetic field to be measured is applied to the sensor 700A. The external magnetic field effects the magnetic repellant force levitating the inner member 720 to displace the inner member 720 along the y direction and change the capacitance levels at $C_1$ and $C_2$. The change in the resonant frequency is then measured to determine the displacement of the inner member 720 with respect to the outer member 710, and hence, the external magnetic field.

Figure 7B:
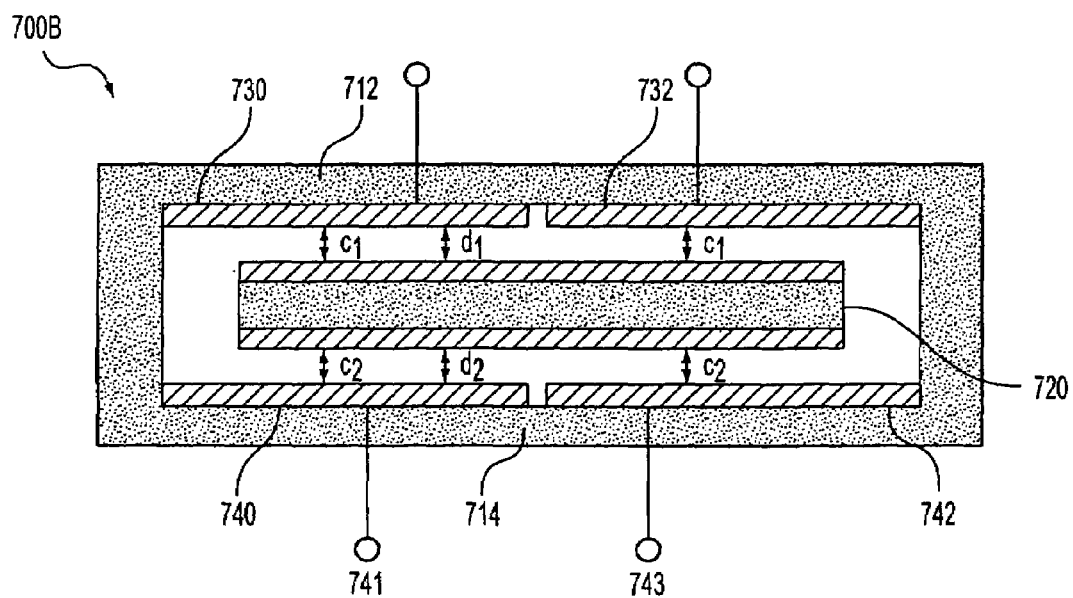
FIG. 7B is another embodiment of the invention for detecting a change in capacitance and FIGS. 7C and 7D show other embodiments of the invention.
Figure 7C:
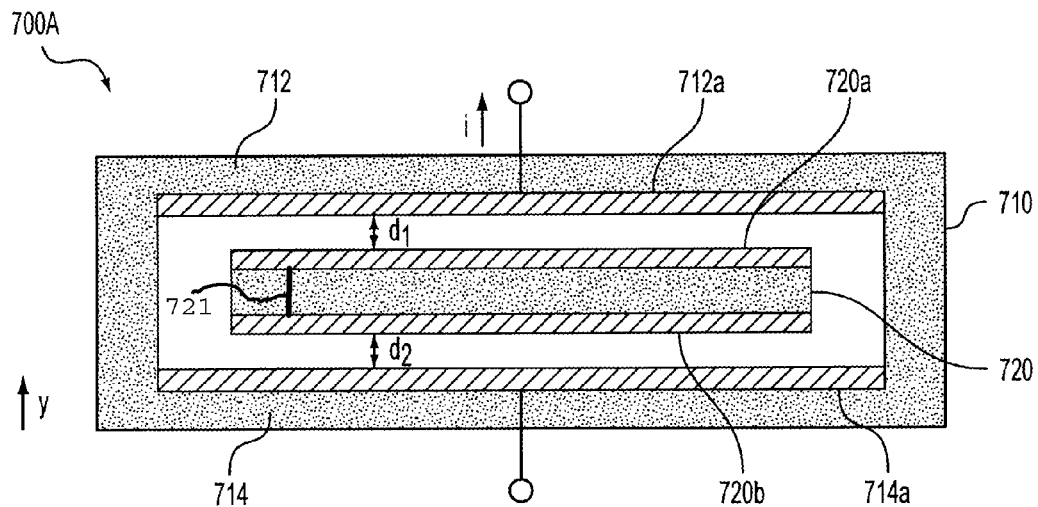
Figure 7D:
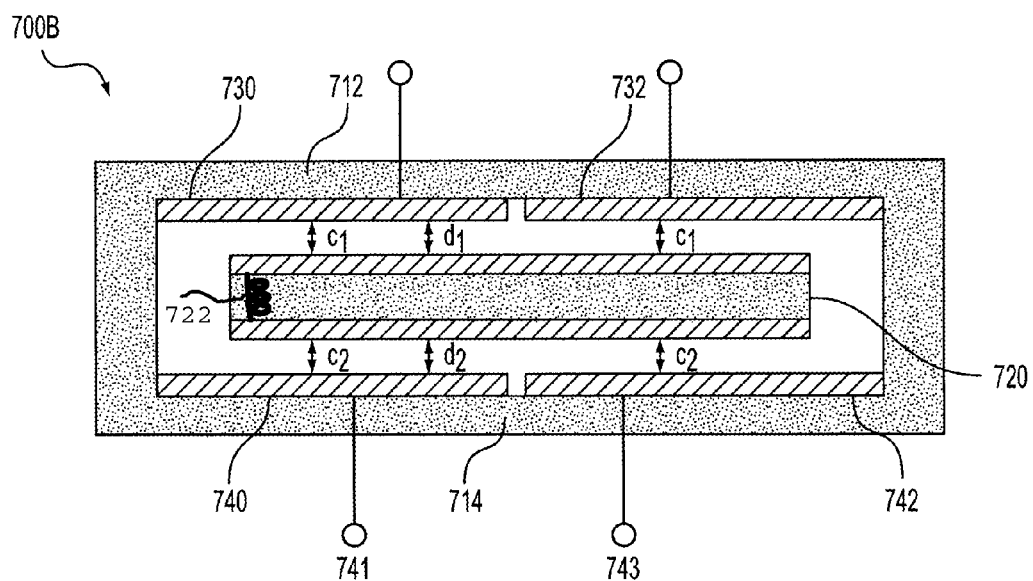

In another embodiment shown in FIG. 7B, there is a magnetic sensor device 700B including two electrodes 730 and 732 disposed at the upper member 712 and two electrodes 740 and 742 disposed at the lower member 714. For example, the electrodes 730 and 732 may be patterned from a single electrode, such as the parallel plate electrode 712a of the magnetic sensor 700A. By measuring signals between electrodes 730 and 732 (or electrodes 740 and 742), the change of capacitance $C_1$ (or $C_2$) due to a displacement of the inner member 720 can be measured by the electrodes 730, 732. In one embodiment, the change of capacitance $C_1$ is measured between the electrodes 730, 732 in a manner similar to the way the capacitance $C_1$ between the parallel plate electrodes 712a and 714a of the magnetic sensor 700A, is measured. With the change in capacitance, the displacement of the inner member 720 can be determined.

Figure 8:
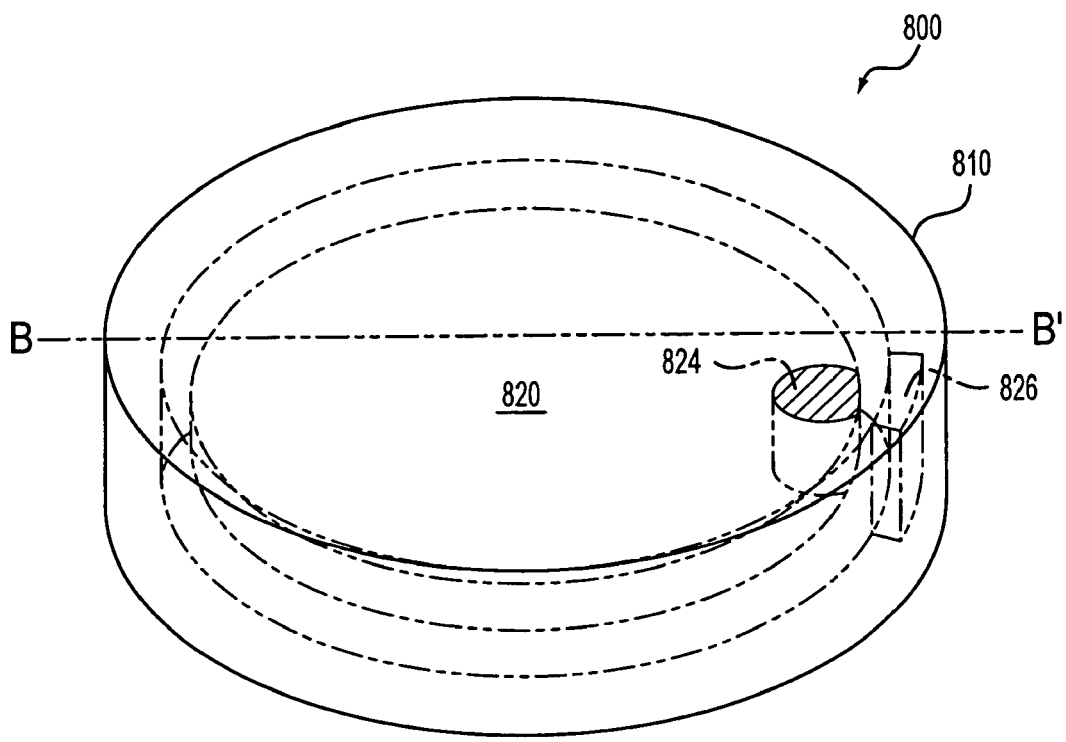
FIG. 8 is another embodiment of the invention for detecting angular displacement and motion.

In another alternative embodiment shown in FIG. 8, an angular motion sensor 800 detects angular motion such as angular displacement and angular motion such as angular velocity and angular acceleration of a magnetically levitated inner member 820 relative to an outer member 810. As shown in FIG. 8, the angular motion is detected by using a signal means 824 disposed on the inner member 820 and detecting means 826 on the outer member 810. Examples of signal means 824 used in conjunction with the detecting means 826 include a light reflecting/emitting component used in conjunction with a light emitter/sensor, a magnetic field emitter used in conjunction with a magnetic field detector, etc. Specifically, at least one magnetic material is disposed on the magnetically levitated inner member 820 as the signal means 824, off-center from the rotating axis of the inner member 820, and a Hall-type sensor is disposed on the outer member 810 as the detecting means 826. The use of the at least one magnetic material as the signal means 824 allows the measurement of angular velocity and angular acceleration of the inner member 820 relative to the outer member 810.

Figure 9:
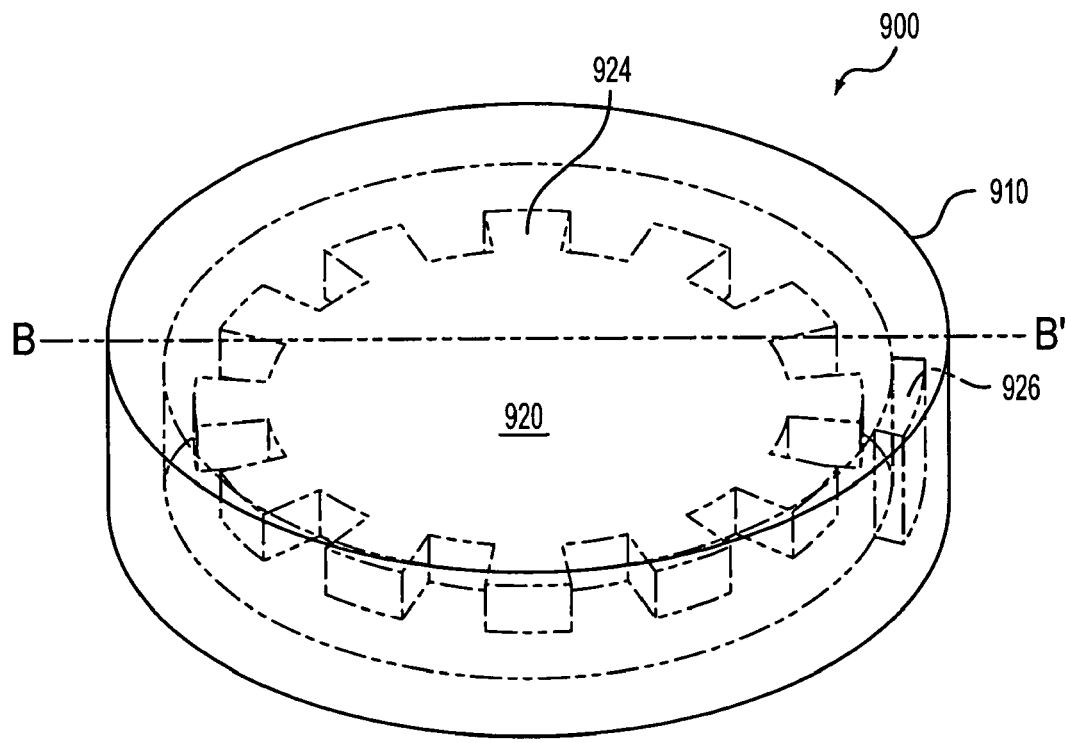
FIG. 9 illustrates yet another embodiment of the invention to detect angular displacement and motion.

Another embodiment of the present invention as an angular motion sensor 900 is shown in FIG. 9. If a plurality of signal means 924 are evenly disposed radially around the outer portions of the inner member 920, then measurements of the angular position of the inner member 920 relative to the outer member 910 are possible by measuring the number of times one of the plurality of signal means 924 passes the detecting means 926.

Figure 10:
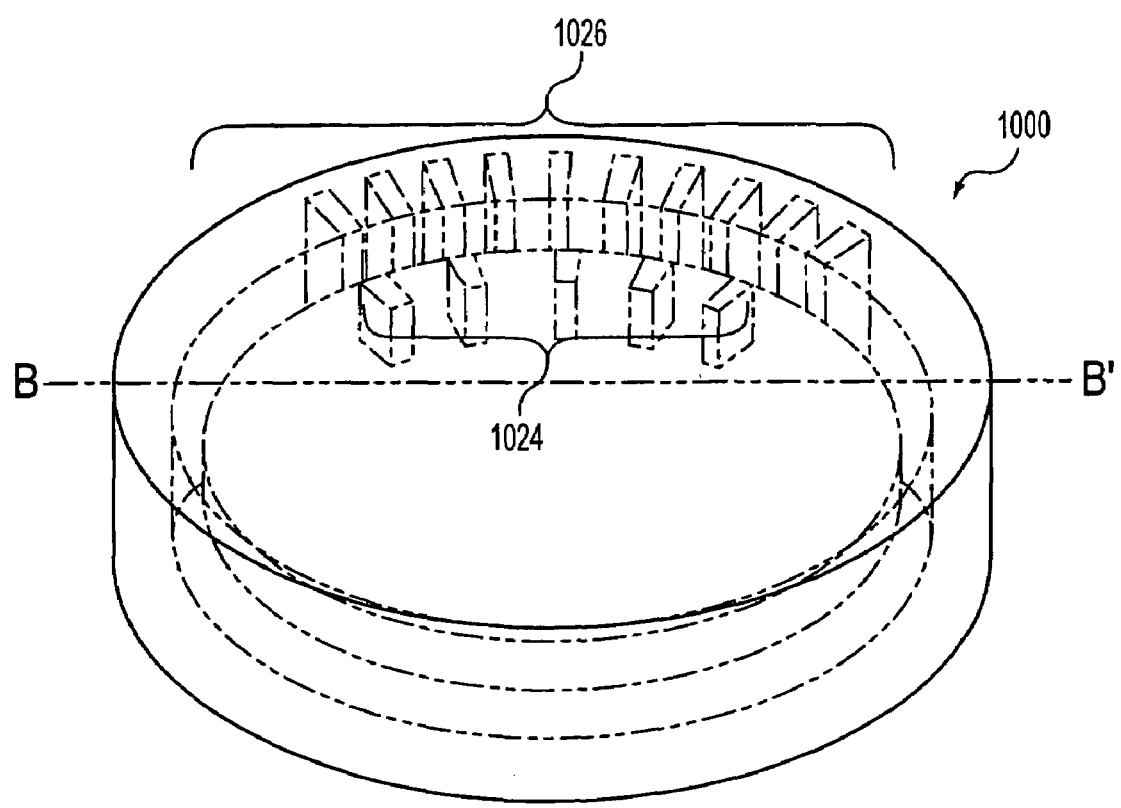
FIG. 10 illustrates an embodiment of the invention for detecting angular displacement using a vernier scale.

In yet another embodiment shown in FIG. 10, a plurality of signal means 1024 and a plurality of detecting means 1026 are disposed at different increments or scales in magnetic sensor 1000. The positions of the plurality of signal means 1024 and the plurality of detecting means 1026 allow for precise determination of the angular displacement using the same principles of operation used by a vernier caliper.

Another embodiment of the invention is for use in an altimeter. Since gravity is a function of altitude, the gravitational force on a magnetically levitated inner member is less at higher altitudes. Thus, at higher altitudes, the inner member floats higher inside the magnetic sensor to change the measured capacitances. In another aspect of the invention, the current altitude can be determined by calculating the total change in vertical distance. The total change in vertical distance can be calculated by measuring the vertical acceleration.

By using a MEMS fabrication process, sensor devices of the present invention can be made with techniques and tools that allow silicon to be machined with micrometric precision in a very cost effective high volume batch manufacturing process.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A microelectromechanical system (MEMS) sensor comprising:
   a lower magnetic member comprising a first magnetic layer of the lower magnetic member and a lower base layer;
   an upper magnetic member disposed over said lower magnetic member, the upper magnetic member comprising a first magnetic layer of the upper member and an upper base layer;
   an intermediate magnetic member magnetically levitated between said lower magnetic member and upper magnetic member, the intermediate magnetic member comprising a first magnetic layer of the intermediate magnetic member and a second magnetic layer of the intermediate magnetic member;
   a detector measuring at least one of motion of, forces acting on, and displacement of the intermediate magnetic member with respect to the lower magnetic member and the upper magnetic member; and
   an electric coupling,
   wherein the detector comprises:
      a first conductive plate disposed at said lower magnetic member;
      a first intermediate conductive plate disposed at one side of said intermediate magnetic member facing said first conductive plate;
      a second conductive plate disposed at said upper magnetic member; and
      a second intermediate conductive plate disposed at another side of said intermediate magnetic member facing said second conductive plate, wherein the displacement of said intermediate magnetic member is determined in accordance with at least one of a current and a resonant frequency measured between said first conductive plate and said second conductive plate,
   wherein the electric coupling is a conductor which connects the first intermediate conductive plate and the second intermediate conductive plate and
   wherein coercivities of the lower and the upper magnetic members are greater than a coercivity of the intermediate magnetic member.

2. The MEMS sensor of claim 1, wherein said first conductive plate and said first intermediate conductive plate having a first capacitance based on a first distance between said first conductive plate and said first intermediate conductive plate, said second conductive plate and said second intermediate conductive plate having a second capacitance based on a second distance between said second conductive plate and said second intermediate conductive plate, and the at least one of the motion of, the forces acting on, and the displacement of the intermediate magnetic member is determined by measuring a change in at least one of the first and the second capacitances.

3. The MEMS sensor of claim 1, wherein the detector comprises:
   at least one signal component disposed on said intermediate magnetic member, generating a signal; and
   a signal sensor measuring the signal generated by said at least one signal component when said intermediate magnetic member rotates about an axis, to measure angular acceleration of said intermediate magnetic member.

4. The MEMS sensor of claim 3, wherein said at least one signal component is disposed off-center from the axis and said signal sensor measures the signal when the at least one signal component is proximal to said signal sensor.

5. The MEMS sensor of claim 3, wherein said at least one signal component is a plurality of signal components.

6. The MEMS sensor of claim 1, wherein the detector comprises:
   at least one signal component disposed on said intermediate magnetic member, generating a signal; and
   a signal sensor measuring the signal generated by said at least one signal component when said intermediate magnetic member is rotatively displaced about an axis substantially orthogonal to said intermediate magnetic member, to measure at least one of an angular displacement and angular motion of said intermediate magnetic member.

7. The MEMS sensor of claim 6, wherein the detector comprises a plurality of signal components and the at least one of the angular displacement and angular motion is measured in accordance with a number of components proximally passing said signal sensor.

8. The MEMS sensor of claim 1, wherein a first magnetic surface of said lower magnetic member and a first magnetic surface of said intermediate magnetic member facing said lower magnetic member each has a first magnetic polarity and a first magnetic surface of said upper magnetic member and a second magnetic surface of said intermediate magnetic member facing said upper magnetic member each has a second magnetic polarity, and the first magnetic polarity is opposite to the second magnetic polarity to magnetically levitate said intermediate magnetic member between the lower and upper magnetic members.

9. The MEMS sensor of claim 1 further comprising a means for positioning said intermediate magnetic member between the upper and lower magnetic members.

10. The MEMS sensor of claim 9, wherein the means for positioning comprises a spindle disposed through a center hole of said intermediate magnetic member.

11. The MEMS sensor of claim 1, wherein said intermediate magnetic member has a first magnetic surface area, the upper and lower magnetic members have a second magnetic surface area and a third magnetic surface area, respectively, and the first magnetic surface area having a shape different from each of the second and third magnetic surface areas.

12. The MEMS sensor of claim 1, wherein at least one of the upper, intermediate, and lower magnetic members comprises a plurality of discrete magnetic structures.

13. The MEMS sensor of claim 12, wherein the plurality of discrete magnetic structures are pillar-shaped.

14. The MEMS sensor of claim 13, wherein the plurality of discrete magnetic structures are not electromagnets.

15. The MEMS sensor of claim 1, wherein the first conductive plate is connected to a first terminal and second conductive plate is connected to a second terminal, and at least one of the current and the resonant frequency is measured at the first and the second terminals.

16. A method of measuring at least one of a motion and a displacement of a microelectromechanical system (MEMS) device comprising an inner member magnetically levitated between a substrate and an upper member, at least one signal component disposed on said inner member, and a detector disposed on said substrate, the method comprising:
  detecting a signal emitted from said at least one signal component when said at least one signal component proximally passes said detector when the inner member rotates; and
  calculating the at least one of the motion and the displacement of the inner member from the signal, wherein the inner member is levitated between permanent magnets at the substrate and the upper member,
  wherein coercivities of the substrate and the upper member are greater than a coercivity of the inner member.

17. The method of claim 16, wherein the displacement is angular displacement.

18. A method of measuring an angular motion of a microelectromechanical device comprising an inner member magnetically levitated between a substrate and an upper member, at least one signal component disposed on said inner member, and a detector disposed on said substrate, the method comprising:
  detecting a signal emitted from said at least one signal component when said signal component proximally passes said detector when the inner member rotates; and
  calculating at least one of angular velocity and angular acceleration of said inner member from the signal, wherein the inner member is levitated between permanent magnets at the substrate and the upper member,
  wherein coercivities of the substrate and the upper member are greater than a coercivity of the inner member.

19. A microelectromechanical system (MEMS) sensor comprising:
  a substrate;
  a lower magnetic member disposed on said substrate;
  a layer disposed over said substrate;
  an upper magnetic member disposed at a side of said layer facing said lower magnetic member;
  an intermediate magnetic member magnetically levitated between said lower magnetic member and upper magnetic member;
  means for measuring at least one of motion of, forces acting on, and displacement of the intermediate magnetic member; and
  an electric coupling,
  wherein the means for measuring measures at least one of motion of, forces acting on, and displacement of the intermediate magnetic member with respect to the lower magnetic member and the upper magnetic member;
  wherein the means for measuring comprises:
    a first conductive plate disposed at said lower magnetic member;
    a first intermediate conductive plate disposed at one side of said intermediate magnetic member facing said first conductive plate;
    a second conductive plate disposed at said upper magnetic member; and
    a second intermediate conductive plate disposed at another side of said intermediate magnetic member facing said second conductive plate, wherein the displacement of said intermediate magnetic member is determined in accordance with at least one of a current and a resonant frequency measured between said first conductive plate and said second conductive plate,
  wherein the electric coupling is a conductor which connects the first intermediate conductive plate and the second intermediate conductive plate, and
  wherein coercivities of the lower and the upper magnetic members are greater than a coercivity of the intermediate magnetic member.

20. A microelectromechanical system (MEMS) sensor comprising:
  a lower magnetic member comprising a lower magnetic surface of a first magnetic polarity;
  an upper magnetic member disposed over said lower magnetic member comprising an upper second magnetic surface of a second magnetic polarity;
  an intermediate magnetic member magnetically levitated between said lower magnetic member and upper magnetic member, said intermediate magnetic member comprising a first magnetic surface of the first magnetic polarity facing said lower magnetic surface and a second magnetic surface of the second magnetic polarity facing said upper magnetic surface, the first magnetic polarity being opposite to the second magnetic polarity to magnetically levitate said intermediate magnetic member between the lower and upper magnetic members; and
  a detector measuring displacement of the intermediate magnetic member with respect to the lower magnetic member and the upper magnetic member, the detector comprising:
    a first conductive plate disposed at said lower magnetic member;
    a first intermediate conductive plate disposed at one side of said intermediate magnetic member facing said first conductive plate, the first conductive plate and the first intermediate conductive plate forming a first capacitor;

a second conductive plate disposed at said upper magnetic member; and a second intermediate conductive plate disposed at another side of said intermediate magnetic member facing said second conductive plate, the second conductive plate and the second intermediate conductive plate forming a second capacitor, wherein the displacement of said intermediate magnetic member is measured in accordance with at least one of i) a current measured between said first conductive plate and said second conductive plate; ii) a resonant frequency measured across said first conductive plate and said second conductive plate; and iii) a change in at least one of a first capacitance measured at said first capacitor and a second capacitance measured at said second capacitor, wherein a conductor connects the first intermediate conductive plate and the second intermediate conductive plate, and wherein coercivities of the lower and the upper magnetic members are greater than a coercivity of the intermediate magnetic member.

21. The MEMS sensor of claim 20, wherein the first conductive plate is divided into at least two parts and a change of the first capacitance due to at least one of a motion of, forces acting on, and a displacement of the inner member is measured between the at least two parts of the first conductive plate.

22. The MEMS sensor of claim 20, wherein a second conductive plate is divided into at least two or more parts and a change of the second capacitance due to at least one of a motion of, forces acting on, and a displacement of the inner member is measured between the at least two parts of the second conductive plate.

* * * * *